United States Patent [19]

Shinagawa et al.

[11] Patent Number: 5,317,537
[45] Date of Patent: May 31, 1994

[54] MULTI-PORT MEMORY DEVICE HAVING PRECHARGED BIT LINES

[75] Inventors: Satoshi Shinagawa, Akishima; Yoichi Sato, Iruma; Masami Hasegawa; Yasushi Shimono, both of Fussa; Masayuki Miyasaka, Sagamihara; Takatoshi Tamura, Akishima; Yoshio Iioka, Kokubunji, all of Japan

[73] Assignees: Hitachi, Ltd., Tokyo; Hitachi VLSI Engineering Corp., Lodaira, both of Japan

[21] Appl. No.: 888,493

[22] Filed: May 27, 1992

[30] Foreign Application Priority Data

May 28, 1991 [JP] Japan .................. 3-152352

[51] Int. Cl.⁵ .............................. G11C 13/00
[52] U.S. Cl. ............... 365/189.04; 365/203; 365/207; 365/210
[58] Field of Search ............. 365/189.04, 189.08, 365/203, 230.05, 53, 207, 210

[56] References Cited

U.S. PATENT DOCUMENTS 4,962,476 10/1990 Kawada ................ 365/53
5,185,722 2/1993 Ota et al. ............ 365/189.04

Primary Examiner—Terrell W. Fears
Attorney, Agent, or Firm—Antonelli, Terry, Stout & Kraus

[57] ABSTRACT

A multi-port memory device has a memory cell array including one or more memory blocks each of which has a plurality of memory cells arranged in rows and columns, and a plurality of dummy cells, with one dummy cell being provided for each row of memory cells in each of the memory blocks so that the dummy cells are connected with associated ones of the word lines extending in the row direction. The dummy cells are further connected with dummy cell bit lines extending in the column direction. Sense amplifiers are connected to receive outputs of those memory cells in the memory cell array which are selected in a memory cell selection operation and outputs of those dummy cells among the plurality of dummy cells which are selected in the memory cell selection operation for amplifying differences between the selected memory cell outputs and the selected dummy cell outputs. Precharging and shielding arrangements are also provided for improved operation.

17 Claims, 9 Drawing Sheets

⊠ : CONTACT / THROUGH HOLE

FIG. 9

MULTI-PORT MEMORY DEVICE HAVING PRECHARGED BIT LINES

BACKGROUND OF THE INVENTION

The present invention relates generally to a multi-port memory device. More particularly, the present invention is concerned with techniques which can be utilized effectively and profitably for realizing among others, three-port RAM (Random Access Memory) devices and the like which are included, for example, in digital switch integrated circuits serving as time switches in a time-sharing digital exchange.

Such a multi-port memory is known which is provided with a plurality or multiplicity of access ports including write ports and/or read ports. Further, there is also known a time-sharing digital exchange in which a digital switch integrated circuit including the multi-port memory device is used as a time switch.

Figure 1:
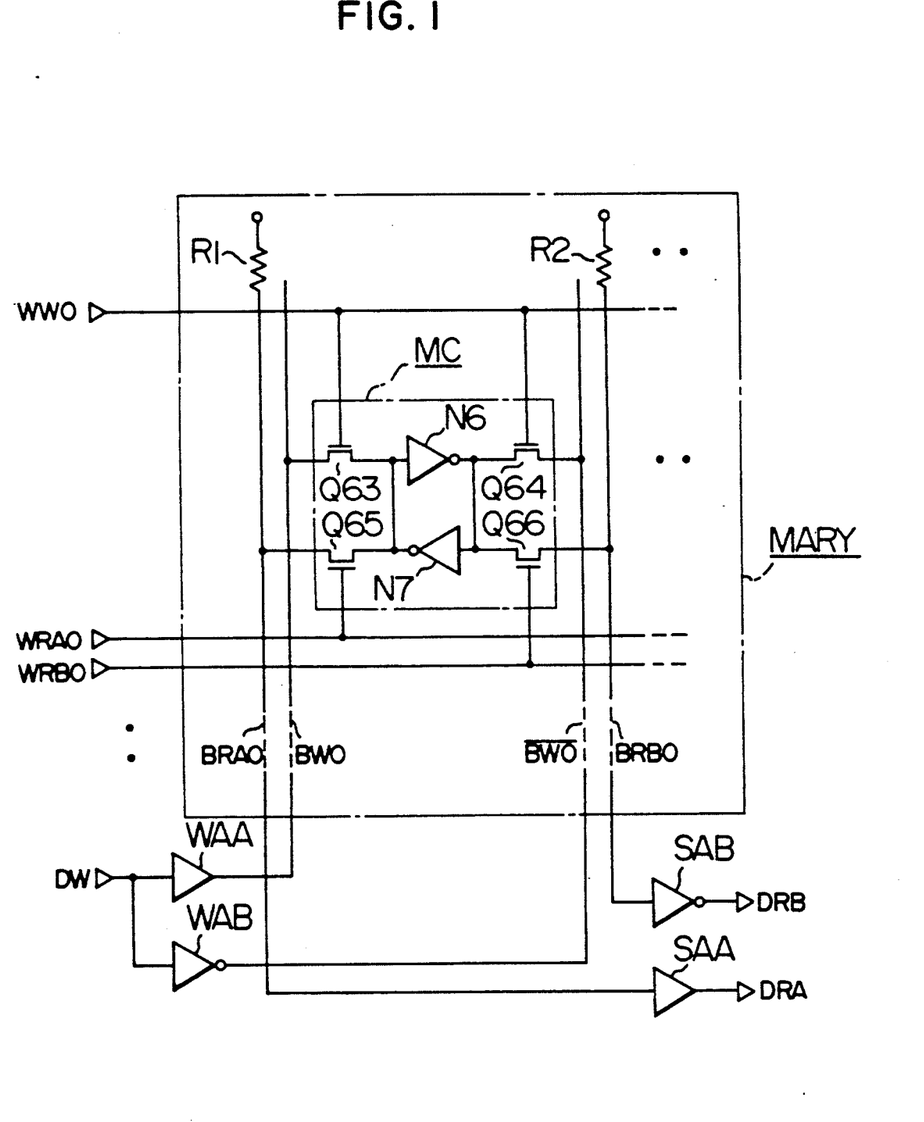
FIG. 1 is a fragmental circuit diagram showing a memory cell array and peripheral circuitries thereof included in a three-port RAM device known heretofore.

The multi-port memory requires a plurality of word lines and bit lines to be provided in correspondence to the individual access ports. Consequently, as the number of the access ports increases, the layout area required for implementing the multi-port memory increases with the layout design becoming more intricate and complicated. As an approach for coping with this problem, there has already been proposed a three-port RAM device such as shown in FIG. 1 of the accompanying drawing with a view to achieving reduction of the required layout area and simplification of the layout design by implementing the read bit line by a single-ended or simplex line. More specifically, in the three-port RAM device known heretofore such as shown in FIG. 1, each of static type memory cells MC constituting a memory cell array MARY includes as a basic component a latch circuit constituted by a pair of inverters N6 and N7 cross-coupled to each other. The latch circuit has non-inverted and inverted input/output nodes which are coupled to non-inverted and inverted signal lines such as write bit lines BW0* (representing collectively a non-inverted write bit line BW0 and an inverted write bit line $\overline{BW0}$) through a pair of write control MOSFETs (Metal Oxide Semiconductor Type Field-Effect Transistor; hereinafter, the insulated-gate field-effect transistor will collectively be referred to as MOSFET in abbreviation) Q63 and Q64 having respective gates coupled to a write word line WW0, and which are additionally coupled to read bit lines BRA0 and BRB0 through read control MOSFETs Q65 and Q66 having gates coupled to corresponding read word lines WRA0 and WRB0, respectively.

The read bit lines BRA0 and BRB0 are coupled to a power supply of the circuit via associated load circuitries or resistors R1 and R2, respectively, on one hand and coupled to input terminals of associated sense amplifiers SAA and SAB, respectively, on the other hand. The resistors R1 and R2 are imparted with such predetermined resistance values that level drop or lowering of level on the read bit line BRA0 or BRB0 falls below a logical threshold value of the sense amplifier SAA or SAB when the read control MOSFET Q65 or Q66 of the memory cell MC is turned on. In the sense amplifier SAA, the non-inverted output signal is delivered as a read data signal DRA, while from the sense amplifier SAB, the inverted output signal is delivered as a read data signal DRB. In this way, in the three-port RAM shown in FIG. 1, the read bit line is, so to say, simplexed (i.e. a single bit line is employed for each of the non-inverted output bit line and the inverted output bit line) by using the so-called single-ended sense amplifiers SAA and SAB in an effort to reduce the layout area required for implementation of the three-port RAM while simplifying the layout design.

For further particulars of the three-port RAM in which the read bit line is simplexed (or single-ended), reference may be made, for example, to JP-A-57-60586 (laid-open on Apr. 12, 1982).

SUMMARY OF THE INVENTION

The inventors of the present application have discovered after a series of studies and experiments that the three-port RAM device described above still suffers from problems remaining not solved which remain unsolved. As described above, the prior art three-port RAM is provided with the load resistors R1 and R2 in correspondence to the read bit lines BRA0 and BRB0, respectively, wherein such a relatively large read current can be caused to flow through the load resistors R1 and R2 that the drop or lowering in the level on the bit lines falls below the logical threshold level of the sense amplifiers SAA and SAB. Besides, because the sense amplifiers SAA and SAB are each implemented in the single-ended structure, the operation margin of these sense amplifiers is relatively narrow. For these reasons, the resistance values of the load resistors R1 and R2 as well as the characteristics of the MOSFETs constituting the memory cell are likely to be affected by process variations. Such being the circumstances, not only is a limitation necessarily imposed on the attempt to realize the three-port RAM with a low power consumption but also difficulty is encountered in stabilizing the read operation, eventually incurring degradation in the reliability of system operation as a whole.

An object of the present invention is therefore to provide an improved structure of a multi-port memory device which can be realized with a reduced layout area and a simplified layout design while ensuring low power consumption and stabilized operation of the multi-port memory device.

As another object, it is contemplated with the present invention to achieve low power consumption and improved reliability of time-sharing digital exchanges or the like in which the multi-port memory devices are used.

According to one aspect of the present invention, a multi-port memory device has a memory cell array including one or more memory blocks each of which has a plurality of memory cells arranged in rows and columns, a plurality of dummy cells, one provided for each row of memory cells in each of the memory blocks so that the dummy cells are connected with associated ones of the word lines extending in the row direction, the dummy cells being further connected with dummy cell bit lines extending in the column direction, and sense amplifiers connected to receive outputs of those memory cells in the memory cell array which are selected in a memory cell selection operation and outputs of those dummy cells among the plurality of dummy cells which are selected in the memory cell selection operation for amplifying differences between the selected memory cell outputs and the selected dummy cell outputs.

According to another aspect of the present invention, each of the read bit lines of the multi-port memory device is constituted by a simplex (single-ended) signal line, wherein the read bit lines are precharged to a source voltage of high potential. Further, a plurality of dummy cell bit lines each capable of cooperating with an arbitrary one of the read bit lines are provided. The sense amplifier for amplifying the read signal is implemented in a so-called differential input configuration, wherein a non-inverted input terminal and an inverted input terminal of the sense amplifier are correspondingly connected to the memory cell read bit line and the dummy cell read bit line, respectively. The dummy cell coupled to each dummy cell read bit line may basically be constituted by four MOSFETs connected, for example, in a serial configuration, wherein each two of these MOSFETs may be of same structures as the read control MOSFETs of the static type memory cell and N-channel MOSFETs constituting an inverter of the latch circuit of the memory cell, respectively. A shield conductor constituted, for example, by a source voltage supply conductor or a ground potential supply conductor may be provided between the memory cell write bit line and the memory cell read bit line.

Owing to the features of the invention mentioned above, the signal amplitude on the memory cell read bit line can be made smaller to thereby diminish magnitude of the corresponding read current, while a stabilized reference potential can be established by the dummy cell to allow the operation margin of the sense amplifier to be enlarged. Besides, noise induced on the read bit line by a full-swing signal on the write bit line can be satisfactorily suppressed, whereby the sense amplifier can be protected against erroneous operation. Thus, reduction in the layout area for the multi-port memory device as well as simplification of the layout design can be achieved while ensuring low power consumption and stabilized operation of the multi-port memory device, which in turn leads to promotion of low power consumption and enhancement of reliability of time-sharing digital exchanges or the like in which the multi-port memories are employed as time switches.

DESCRIPTION OF THE PREFERRED EMBODIMENTS

Now, the present invention will be described in detail in conjunction with preferred or exemplary embodiments thereof by reference to the drawings.

Figure 2:
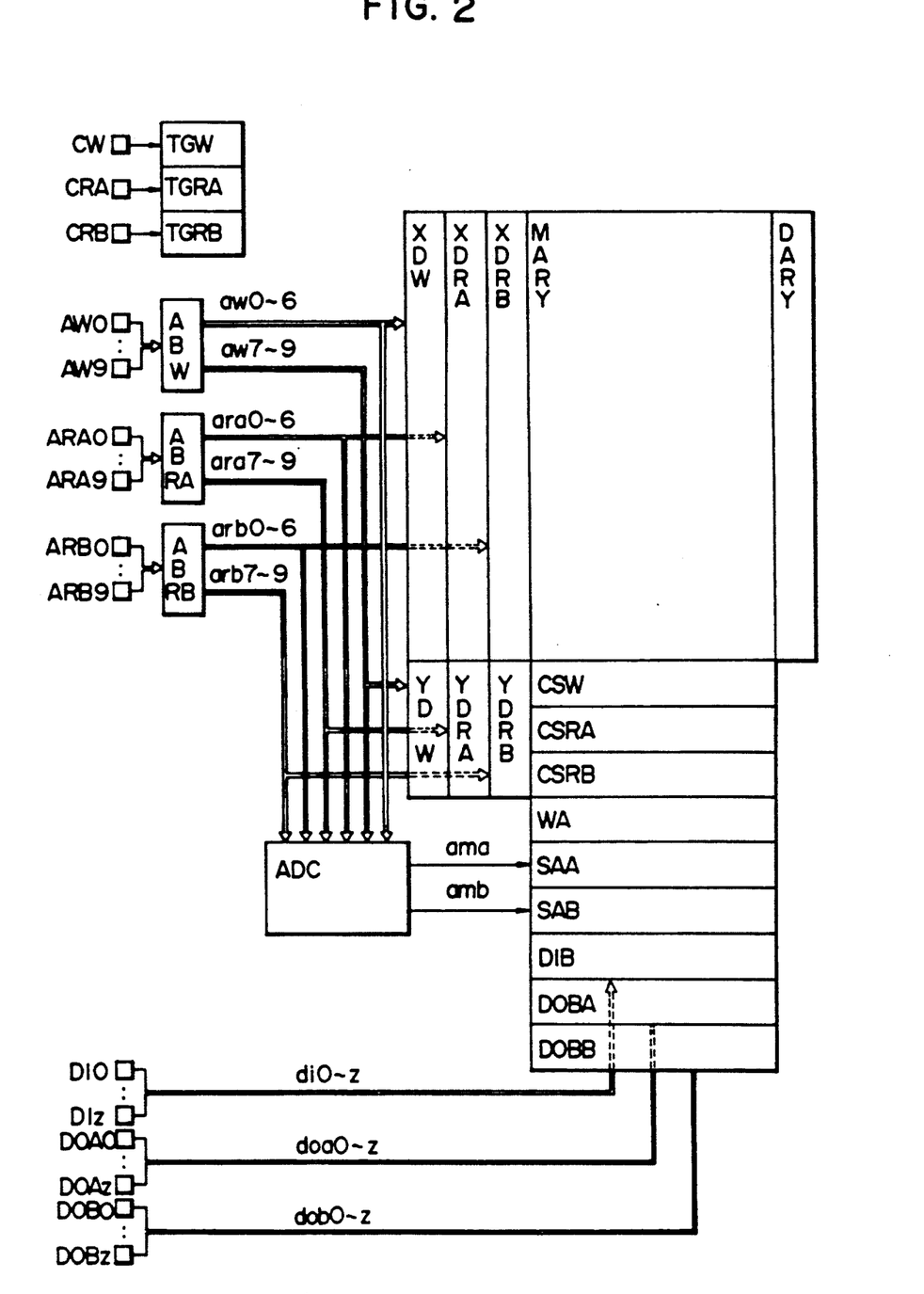
FIG. 2 is a block diagram showing a three-port RAM device according to an embodiment of the invention.
Figure 3:
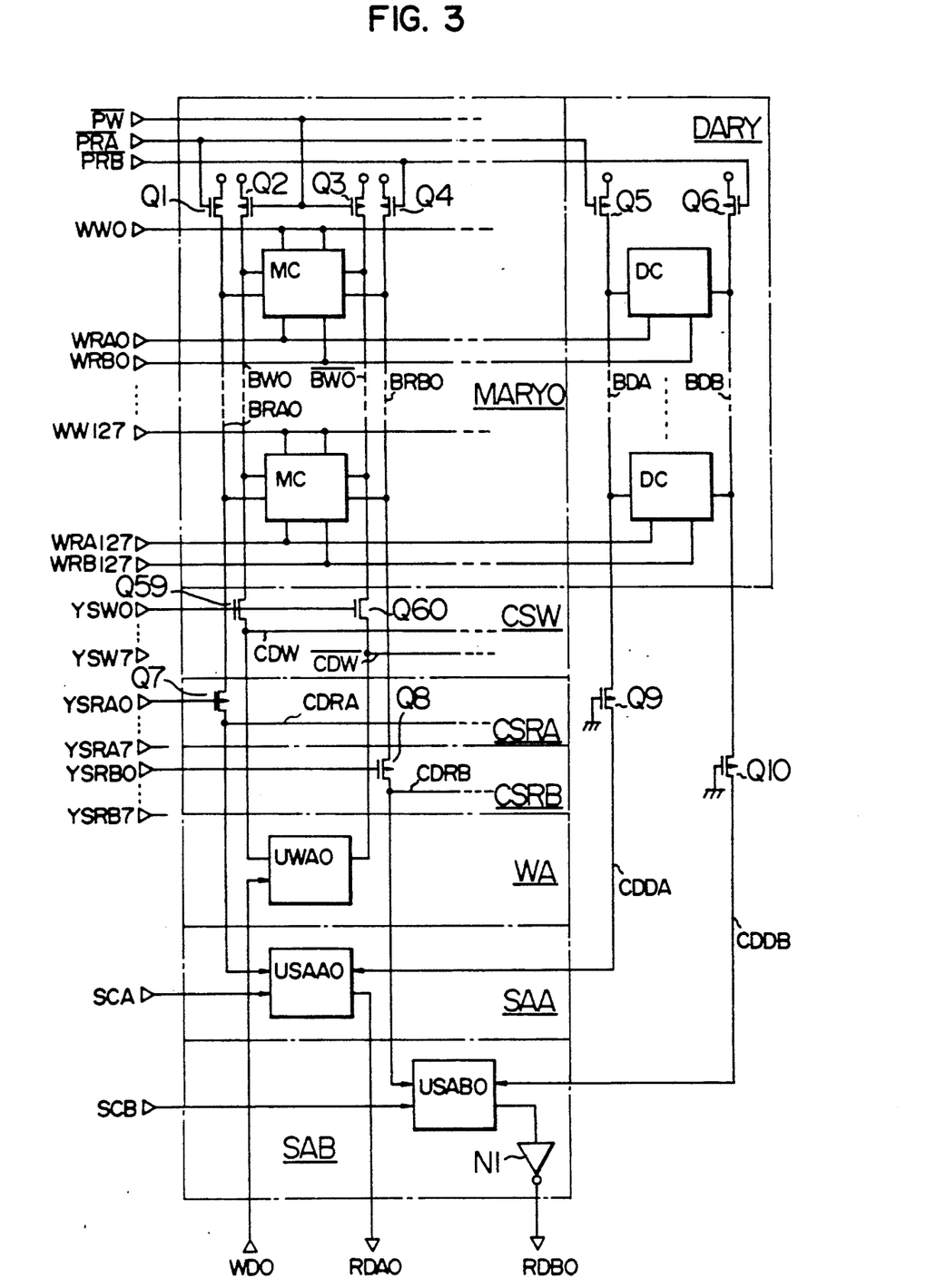
FIG. 3 is a fragmentary circuit diagram showing an array of memory cells, an array of dummy cells and peripheral circuitries included in one of memory blocks of the three-port RAM device shown in FIG. 2.
Figure 4:
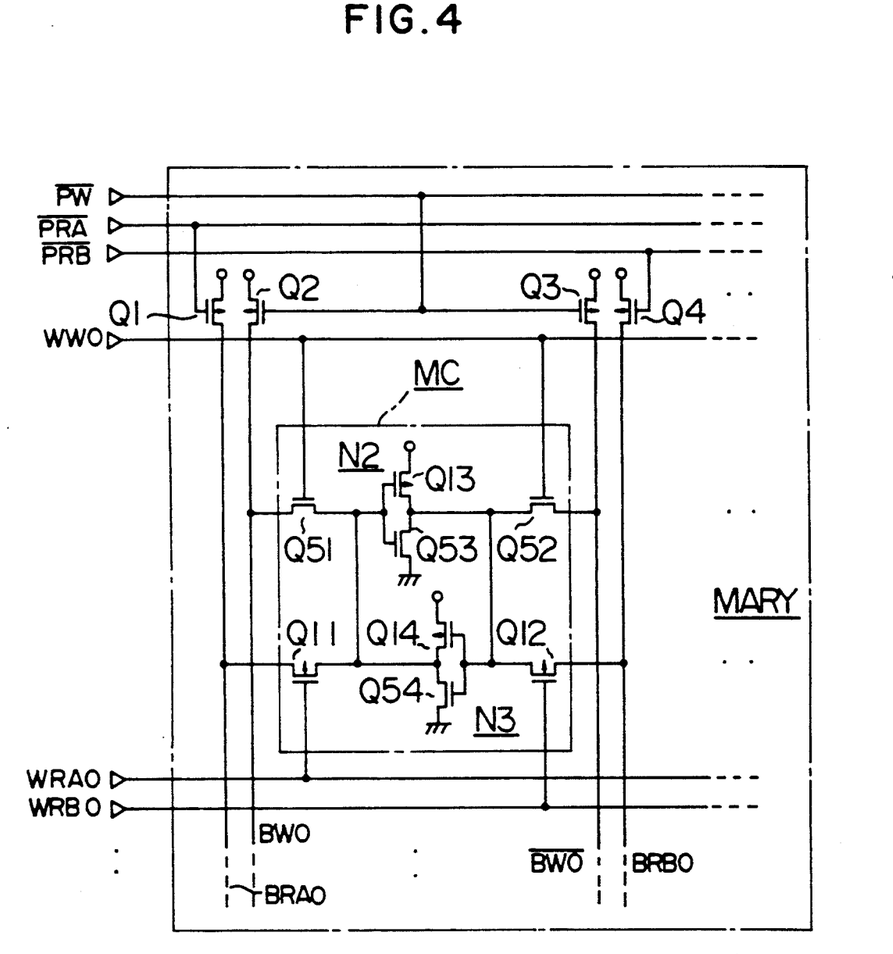
FIG. 4 is a circuit diagram showing an example of a static type memory cell included in the memory block shown in FIG. 3.
Figure 5:
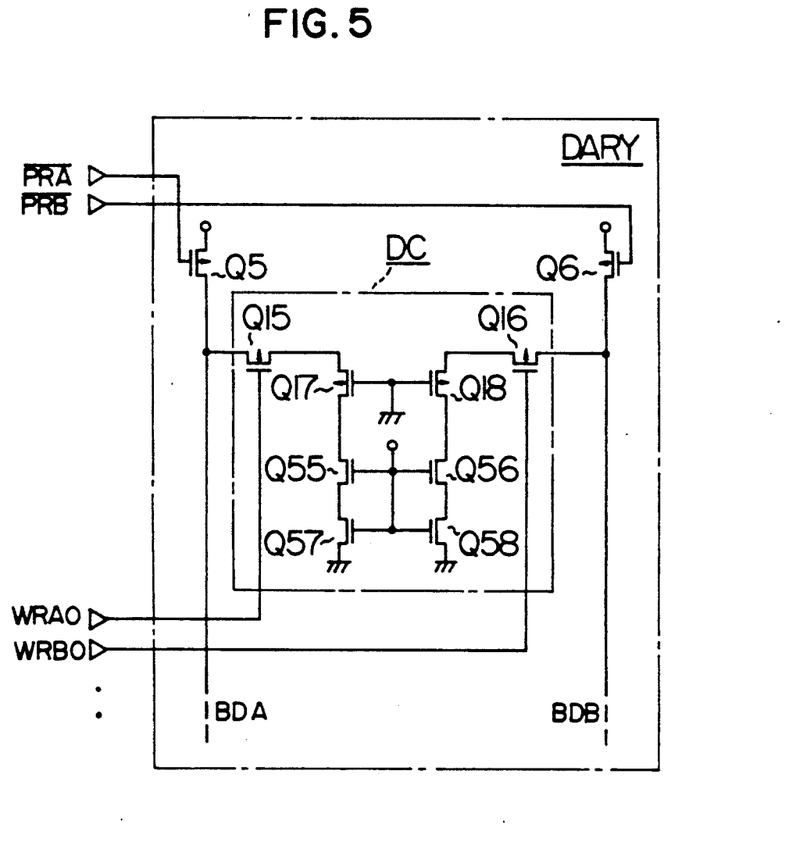
FIG. 5 is a circuit diagram showing an example of the dummy cell included in the dummy cell array shown in FIG. 3.
Figure 6:
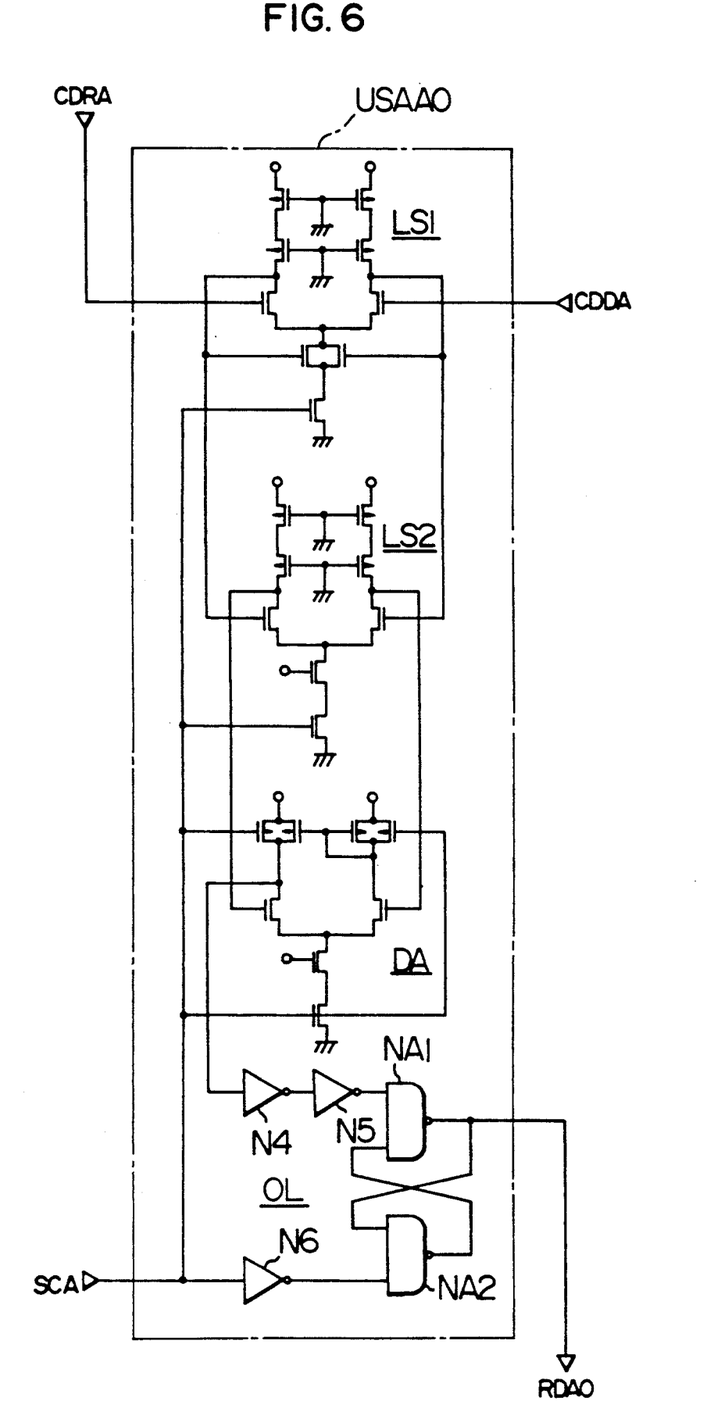
FIG. 6 is a circuit diagram showing an exemplary circuit configuration of a unit sense amplifier included in a sense amplifier block shown in FIG. 3.
Figure 7:
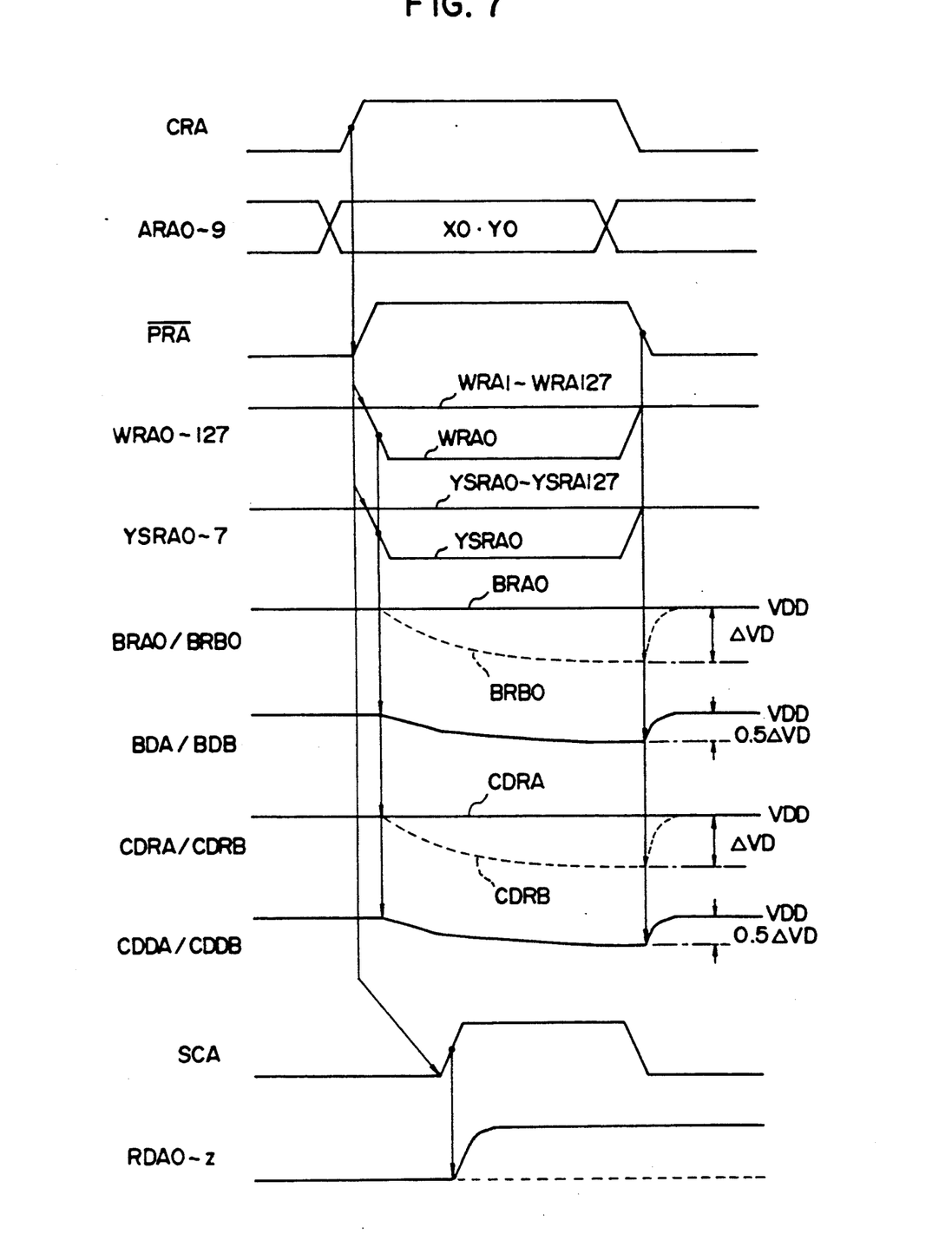
FIG. 7 is a signal waveform diagram showing signals produced in a read operation mode of the three-port RAM device shown in FIG. 2.
Figure 8:
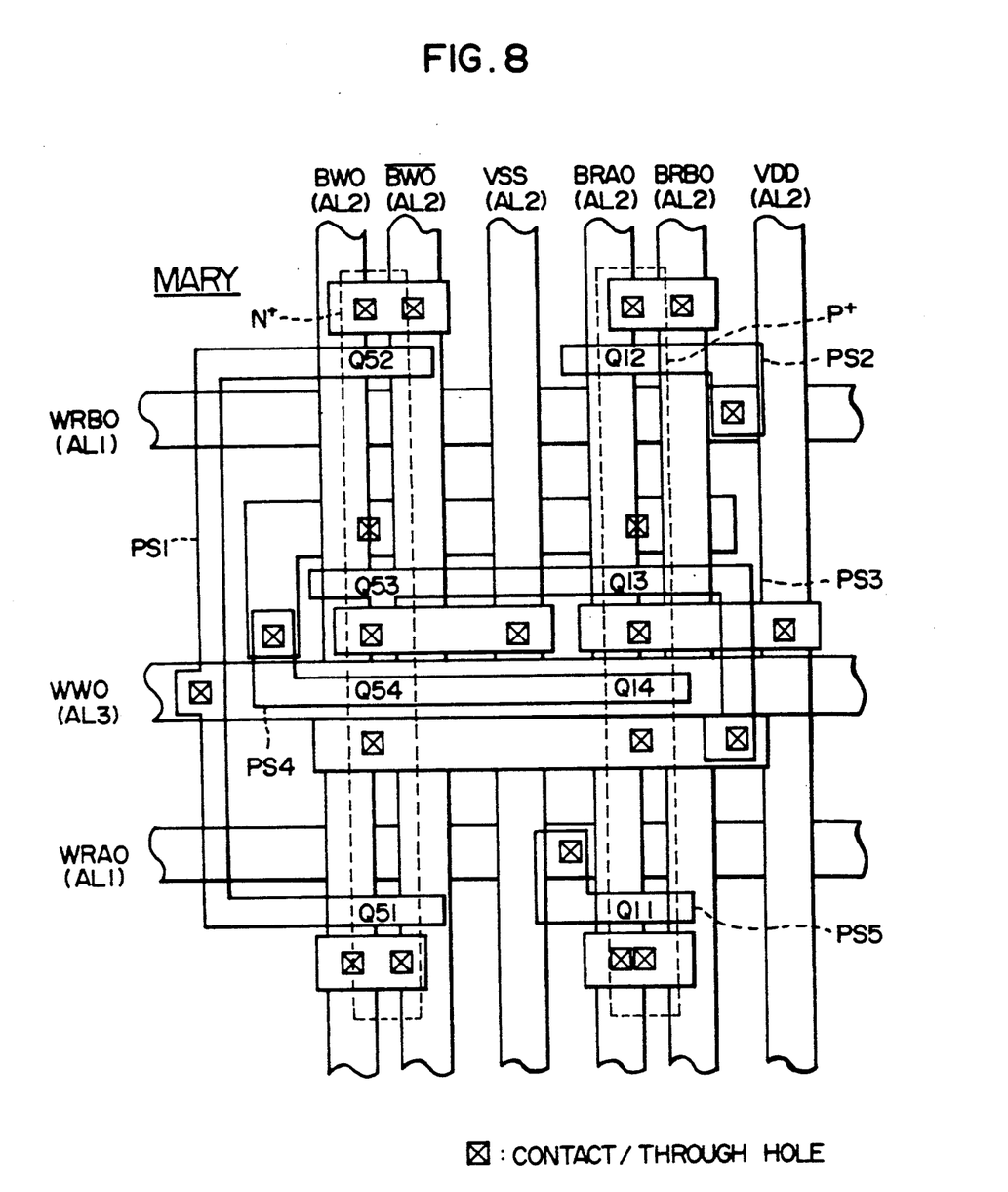
FIG. 8 is a fragmentary plan view showing an example of geometrical disposition or layout of the static type memory cell shown in FIG. 4 and peripheral circuitries thereof.

FIG. 2 is a block diagram showing an arrangement of a three-port RAM device according to an embodiment of the present invention. FIG. 3 is a fragmentary circuit diagram showing one of plural memory blocks constituting a memory cell array MARY, a dummy cell array DARY and typical peripheral circuitries, all of which are included in the three-port RAM device shown in FIG. 2. Further, FIG. 4 is a circuit diagram showing a static type memory cell MC included in the memory block MARY0 shown in FIG. 3, FIG. 5 is a circuit diagram showing a dummy cell DC included in the dummy cell array DARY shown in FIG. 3 and FIG. 6 is a circuit diagram showing an exemplary circuit configuration of a unit sense amplifier USSA0 included in a sense amplifier block SAA shown in FIG. 3. Furthermore, FIG. 7 is a signal waveform diagram showing signals which are produced in a read mode operation of the three-port RAM shown in FIG. 2, and FIG. 8 is a fragmentary layout view showing an exemplary disposition of the static type memory cell MC shown in FIG. 4 and peripheral circuitries thereof. By reference to these figures, structure and features as well as operation of the three-port RAM device according to the instant embodiment of the invention will be described below.

In the description which follows, it is assumed that the three-port RAM device now under consideration is included in a digital switch integrated circuit serving as time switches of a time-sharing digital exchange, it being understood that the use of the three-port RAM device or multi-port memory device in more general terms is never restricted to such specific applications. On the above assumption, the individual circuit elements shown in FIGS. 3 to 6 and those constituting each of the blocks shown in FIG. 2 are implemented on a single semiconductor substrate such as a P-type single-crystal silicon substrate together with other circuit elements (not shown) of the digital switch integrated circuit. In the circuit diagrams referred to in the following description, a P-channel type MOSFET is indicated by affixing an arrow to the channel part to distinguish it from the N-channel MOSFET which is not attached with such arrow. It is further assumed that the three-port RAM device according to the instant embodiment is implemented as a multi-port memory device of multi-bit structure capable of inputting or outputting simultaneously (z+1)-bit data (in the case of the illustrated structure, z=35 and hence the number of the data bits capable of being inputted or outputted simultaneously is 36 bits). In the following, however, description will be made in conjunction with those circuit portions which are associated with the first one of the (z+1) bits, by way of example only.

Now, referring to FIG. 2, a greater part of a substrate area for the layout of the three-port RAM is occupied by the memory cell array MARY. This memory cell array MARY is composed of 36 memory blocks which are disposed in alignment with one another in the direction in which a word line extends, wherein each of the memory blocks is provided in correspondence to one bit of the data for storage. As is shown in FIG. 3 by way of example, each of the memory blocks includes 128 write word lines WW0, ..., WW127 as well as 128 read word lines WRA0, ..., WRA127 (referred to as the first read word lines) and 128 read word lines WRB0, ..., WRB127 (referred to as the second read word lines) which are provided in correspondence to row addresses, respectively, and disposed in parallel with another in the horizontal direction as viewed in FIG. 3 on one hand and 8 sets of memory cell write bit lines BW0*, ..., BW7* as well as 8 sets of memory cell read bit lines BRA0, ..., BRA7 (referred to as the first memory cell read bit lines) and 8 sets of memory cell read bit lines BRB0, ..., BRB7 (referred to as the second memory cell read bit lines) which are provided in correspondence to column addresses, respectively, and disposed in parallel with one another in the vertical direction as viewed in FIG. 3 on the other hand. Disposed at cross points between these word lines and the bit lines are 1024 (=128×8) static type memory cells MC in a row-and-column or matrix array. Thus, each of the memory blocks has a storage capacity of 1024 bits, which in turn means that the three-port RAM device now under consideration has a nominal storage capacity of 36 kilo bits ($\approx 1024 \times 36$). Parenthetically, the memory bit line will hereinafter be referred to simply as the bit line for the simplification of description.

Referring to FIG. 4, each of the static type memory cells MC constituting a part of the memory cell array MARY includes a CMOS inverter N2 which includes a P-channel MOSFET Q13 and an N-channel MOSFET Q53 and a CMOS inverter N3 which includes a P-channel MOSFET Q14 and an N-channel MOSFET Q54. These inverters have respective input terminals and output terminals mutually cross-connected for thereby constituting a latch circuit serving as a memory element of the memory cell. Nodes at which the input terminal of the inverter N2 and the output terminal of the inverter N3 are connected in common are referred to as non-inverted input/output nodes of the associated latch circuits, respectively, wherein the first non-inverted input/output node is coupled to the associated non-inverted bit write line BW0 by way of a N-channel write control MOSFET Q51 having a gate coupled to the associated write word line WW0, while the second non-inverted input/output node is coupled to the associated read bit lines BRA0 by way of a P-channel read control MOSFET Q11 (first read control MOSFET) having a gate coupled to the associated read word line WRA0. Similarly, nodes at which the output terminal of the inverter N2 and the input terminal of the inverter N3 are connected in common to each other are termed the inverted input/output nodes of the associated latch circuit, wherein the first inverted input/output node is coupled to the corresponding inverted write bit line $\overline{BW0}$ via an N-channel write control MOSFET Q52 having a gate coupled to the associated write word line WW0 while the second inverted input/output node is coupled to the associated read bit line BRB0 by way of a P-channel read control MOSFET Q12 (second read control MOSFET) having a gate coupled to the associated read word line WRB0.

In the structure of the static type memory cell MC described above, when the write word line such as WW0 is set to a high level, the first non-inverted input/output node and the first inverted input/output node of the latch circuit of the memory cell MC associated with the above-mentioned word line are selectively connected to the non-inverted signal line and the inverted signal line, respectively, of the corresponding write bit lines BW0*, while when the associated read word line such as WRA0 or WRB0 is set to high level, the second non-inverted or inverted input/output node of the latch circuit of the memory cell MC is selectively connected to the corresponding read bit line such as BRA0 or BRB0. In this manner, the three-port RAM device according to the instant embodiment is provided with one write port and two read ports which can be accessed independent of one another. At this juncture, it should be mentioned that although the write bit line is implemented as the so-called complementary signal lines, as described hereinbefore, the read bit line is implemented as a so-called simplex or single-ended signal line, as a result of which the number of the read bit lines as required can be decreased to a half.

Turning back to FIG. 1, the write word lines WW0 to WW127 constituting parts of the memory array MARY are coupled to a write X-address decoder XDW and set to the selected state in an alternative way. The write X-address decoder XDW is supplied with 7-bit internal address signals aw0, ..., aw6 from a write address buffer ABW and at the same time supplied with predetermined internal control signal (not shown) from a write timing generation circuit TGW. The write X-address decoder XDW is selectively brought to the operating state under the control of the internal control signal mentioned above to decode the internal address signals aw0, ..., aw6 for thereby allowing the associated word write line WW0, ..., WW127 of the memory cell array MARY to be set to the selected state of high level in an alternative manner. Parenthetically, the write timing generation circuit TGW serves to generate a variety of internal control signals as required for the write port on the basis of a write clock signal CW.

Similarly, the read word lines WRA0, ..., WRA127 and WRB0, ..., WRB127 which also constitute parts of the memory cell array MARY (FIG. 3) are coupled to a corresponding read X-address decoder XDRA or XDRB, to be thereby set to the selected state in an alternative manner. These read X-address decoders XDRA and XDRB are supplied with 7-bit internal address signals ara0, ..., ara6 or arb0, ..., arb6 from the corresponding address buffer ABRA or ABRB and at the same time supplied with a predetermined internal control signal (not shown) from a corresponding read timing generation circuit TGRA or TGRB. The read X-address decoders XDRA and XDRB are selectively brought to the operating state under the control of the internal control signal mentioned above to decode the internal address signal ara0, ..., ara6 or arb0, ..., arb6 to thereby set the corresponding read word lines WRA0, ..., WRA127 or WRB0, ..., WRB127 of the memory cell array MARY to the selected state of low level in an alternative manner. At this juncture, it is to be noted that the write word lines WW0, ..., WW127 as well as the read word lines WRA0, ..., WRA127 and WRB0, ..., WRB127 are shared by 36 memory blocks constituting the memory cell array MARY. The read timing generation circuits TGRA and TGRB serve to generate various internal control signals required for the read port on the basis of read clock signal CRA or CRB.

Now, referring to FIG. 3, the write bit lines BW0*, ..., BW7* which constitute parts of each memory block of the memory cell array MARY are coupled on one hand to a source voltage of high potential, i.e., a power supply voltage of the circuit, through associated P-channel precharge MOSFETs Q2 and Q3 and on the other hand connected selectively to common data write lines CDW* by way of corresponding N-channel switch MOSFETs Q59 and Q60 of a write column switch CSW, wherein the gates of the precharge MOSFETs Q2 and Q3 are supplied in common with an inverted internal control signal $\overline{PW}$ from the write timing generation circuit TGW, while the gates of the switch MOSFETs Q59 and Q60 are supplied with corresponding bit line select signal YSW0, ..., YSW7 from a write Y-address decoder YDW (see FIG. 2).

The source voltage of the circuit is assumed to be of a voltage of positive polarity such as +3.3 volts, though not limited to such value. Further, the inverted internal control signal $\overline{PW}$ is set to a low level such as the ground potential of the circuit when the write port is in the non-selected state while being set to high level at a predetermined timing when the write port is switched to the selected state. Besides, the bit line select signals YSW0, ..., YSW7 are all set to low level when the write port is in the non-selected state and switched to high level in the alternative manner at a predetermined timing and in dependence on the internal address signals aw7, ..., aw9 when the write port is set to the selected state.

Thus, it will be understood that when the write port is set to the non-selected state, the precharge MOSFETs Q2 and Q3 in the memory cell array MARY are simultaneously turned on in response to the level change of the inverted internal control signal $\overline{PW}$ to low level. As a consequence, the non-inverted and inverted signal lines of the write bit lines BW0*, ..., BW7* are precharged to high level such as a source voltage of the circuit. At that time, both the switch MOSFETs Q59 and Q60 of the write column switch CSW are turned off, to thereby inhibit the write bit lines BW0*, ..., BW7* from being changed over to the connected state.

When the write port is set to the selected state, the inverted internal control signal $\overline{PW}$ assumes high level in the memory cell array MARY, as a result of which the precharge MOSFETs Q2 and Q3 are both turned off, whereby the precharge operation of the write bit lines BW0*, ..., BW7* is stopped. Further, when the bit line select signal YSW0, ..., YSW7 is set to high level in an alternative manner, the corresponding switch MOSFETs Q59 and Q60 of the write column switch CSW are turned on, resulting in that the common data write lines CDW* and the corresponding write bit lines BW0*, ..., BW7* of the memory cell array MARY are selectively set to the connected state. At that time, a unit write amplifier such as UWA0 of a write amplifier block WA is supplied with input data di0 or other from a data input terminal DI0 or other via a corresponding unit input buffer of a data input buffer circuit DIB (see FIG. 2). Accordingly, the write bit line which is in the connected state is supplied with a predetermined complementary write signal in accordance with the input data di0 or other and hence write data WD0 or other supplied from the corresponding unit write amplifier UWA0 or other of the write amplifier block WA. Thus, write operations are executed in accordance with the 36-bit input data di0, ..., diz simultaneously for the 36 static type memory cells MC which are coupled to the selected write bit lines. As the complementary write signal outputted from the unit write amplifier UWA or other, a full-swing write signal which swings between the high level of the circuit source voltage and the ground potential should be used to thereby ensure high reliability of the write operation to the memory cells.

In a similar manner, the read bit lines BRA0, ..., BRA7 and BRB0, ..., BRB7 which constitute parts of each memory block of the memory cell array MARY are coupled on one hand to the source voltage through corresponding P-channel precharge MOSFETs Q1 or Q4 and on the other hand connected selectively to a common data read line CDRA or CDRB by way of corresponding P-channel switch MOSFET Q7 or Q8 of a read column switch CSRA or CRSB, wherein the gates of the precharge MOSFETs Q1 and Q4 are supplied in common with an inverted internal control signal $\overline{PRA}$ or $\overline{PRB}$ from the read timing generation circuit TGRA or TGRB, while the gates of the switch MOSFETs Q7 and Q8 are supplied with corresponding bit line select signal YSRA0, ..., YSRA7 or YSRB0, ..., YSRB7 from the read Y-address decoder YDRA or YDRB.

The inverted internal control signals $\overline{PRA}$ (and $\overline{PRB}$) are set to a low level such as the ground potential of the circuit when the corresponding read port is set to the non-selected state with the read clock signal CRA or other being of low level while the inverted internal control signal is set to high level at a predetermined timing when the corresponding read port is set to the selected state with the read clock signal CRA or other being at high level, as is shown in FIG. 7. The bit line select signals YSRA0, ..., YSRA7 or YSRB0, ..., YSRB7 are alternatively set to low level in dependence on the internal address signals ara7, ..., ara9 or arb7, ..., arb9.

As will now be understood, when the associated read port is set to the non-selected state, the precharge MOSFETs Q1 and Q4 in the memory cell array MARY are simultaneously turned on (i.e. set to the ON-state) in response to the level change of the inverted internal control signals $\overline{PRA}$ and $\overline{PRB}$ to the low level. As a consequence, the bit read lines BRA0, ..., BRA7 and BRB0, ..., BRB7 are precharged to the high level such as the source voltage of the circuit, as can be seen in FIG. 7. At this time, the read control MOSFETs Q11 and Q12 in each static type memory cell MC are turned off (i.e. set to the OFF-state) with all the word read lines WRA0, ..., WRA127 and WRB0, ..., WRB127 assuming the high level.

When the associated read port is set to the selected state, the inverted internal control signal $\overline{PRA}$ or $\overline{PRB}$ assumes high level, as a result of which the precharge MOSFETs Q1 and Q4 in the memory cell array MARY are both turned off, whereby the precharge operation of the read bit lines BRA0, ..., BRA7 or BRB0, ..., BRB7 is interrupted. Further, when the bit line select signal YSRA0, ..., YSRA7 or YSRB0, ..., YSRB7 are set to the high level in an alternative manner, the associated switch MOSFETs Q7 or Q8 of the column read switch CSRA or CSRB are turned on, resulting in that the common data read line CDRA and the corresponding read bit lines BRA0, ..., BRA7 of the memory cell array MARY or alternatively the common data read line CDRB and the corresponding read bit lines BRB0, ..., BRB7 of the memory cell array MARY are selectively set to the connected state. At that time, in the memory cell array MARY, the read word lines WRA0, ..., WRA127 or WRB0, ..., WRB127 are alternatively set to the selected state of low level, whereby read signals corresponding to the data held by the eight static type memory cells MC coupled to the word lines mentioned above are outputted onto the associated read bit lines BRA0, ..., BRA7 or BRB0, ..., BRB7, as can be seen from FIG. 7.

More specifically, when the data held by the static type memory cell MC coupled to the selected word line is logic "1", the associated read bit line BRA0 or other continues to hold the precharge level of high level, as it is, as is indicated by a solid line curve in FIG. 7. In contrast, the level of the associated read bit line BRB0 or other becomes progressively lowered in dependence on conductances of the read control MOSFET Q12 and the MOSFET Q53 which constitutes a part of the inverter N2 of the latch circuit, as is indicated by a broken curve in FIG. 7. On the other hand, when the data held by the static type memory cell MC coupled to the selected word line is logic "0", the associated read bit line BRB0 or other continues to hold the high precharge level invariably. In contrast, the level of the associated read bit line BRA0 or other becomes progressively lowered in dependence on conductances of the read control MOSFET Q11 and the MOSFET Q54 which constitutes a part of the inverter N3 of the latch circuit.

Level change of the bit read lines BRA0, ..., BRA7 in the connected state thereof is transmitted to the non-inverted input terminal of the corresponding unit sense amplifier USAA0 or other of the sense amplifier block SAA via the common data read line CDRA. In a similar manner, level change of the read bit line BRB0, ..., BRB7 in the connected state is transmitted to the non-inverted input terminal of the corresponding unit sense amplifier USAB0 or other of the sense amplifier block SAB. The inverted input terminal of these unit sense amplifiers are coupled to a common dummy data line CDDA or CDDB.

At this juncture, it should be mentioned that the three-port RAM device according to the instant embodiment of the invention is provided with a dummy cell array DARY which includes a plurality of dummy cells each provided for each row of the memory cells in each of the memory blocks. This dummy cell array DARY includes 36 dummy cell array blocks each provided in correspondence to each of the memory blocks of the memory cell array, wherein each of the dummy cell array blocks includes a pair of dummy cell bit lines BAD (referred to as the first dummy cell bit line) and BDB (referred to as the second dummy cell bit line) and 128 dummy cells DC coupled to these dummy cell bit lines, as can be seen in FIG. 3.

In the case of the instant embodiment of the present invention, each of the dummy cells DC which constitute the dummy cell array DARY includes, as shown in FIG. 5, a serial connection of P-channel MOSFETs Q15 (first P-channel MOSFET) and Q17 (second P-channel MOSFET) and N-channel MOSFETs Q55 (first N-channel MOSFET) and Q57 (second N-channel MOSFET) provided between a dummy bit line BDA and the source voltage of low potential (i.e., ground potential) and a serial connection of P-channel MOSFETs Q16 (first P-channel MOSFET) and Q18 (second P-channel MOSFET) and N-channel MOSFETs Q5 (first N-channel MOSFET) and Q58 (second N-channel MOSFET) provided between a dummy bit line BDB and the ground potential of the circuit. Of the MOSFETs mentioned above, the MOSFET Q15 has a gate coupled to the corresponding word read line WRA0 or other mentioned hereinbefore while the gate of the MOSFET Q16 is coupled to the corresponding read word line RB0 or other also mentioned hereinbefore. On the other hand, the gates of the MOSFETs Q17 and Q18 are coupled to the ground potential of the circuit, while the gates of the MOSFETs Q55 and Q58 are couple to the source voltage of the circuit. With this arrangement, the MOSFETs Q17 and Q18 as well as Q55 to Q58 are constantly maintained in the ON-state. In this dummy cell DC, each of the MOSFETs Q15 to Q18 is implemented in the same structure as the read control MOSFETs Q11 and Q12 which constitutes parts of each static type memory cell MC of the memory cell array MARY, while each of the MOSFETs Q55 to Q58 is implemented in the identical structure with the N-channel MOSFETs Q53 and Q54 included in the inverters N2 and N3, respectively, which constitutes the latch circuit for each of the static type memory cells MC.

The dummy cell bit lines BDA and BDB which constitute parts of the dummy cell array DARY are connected to the source voltage of the circuit via the corresponding P-channel type precharge MOSFET Q5 or Q6 on one hand and connected on the other hand to the dummy common data line CDDA or CDDB mentioned hereinbefore by way of the P-channel MOSFET Q9 or Q10 which are constantly maintained in the ON-state (see FIG. 3). The gate of the precharge MOSFET Q5 is supplied with the inverted internal control signal $\overline{PRA}$ mentioned previously, while the gate of the precharge MOSFET Q6 is supplied with the inverted internal control signal $\overline{PRB}$ mentioned hereinbefore.

It will thus be seen that when the corresponding read part is in the non-selected state with the inverted internal control signals $\overline{PRA}$ and $\overline{PRB}$ being at low level, the dummy cell bit lines BDA and BDB are precharged to high potential level such as that of the source voltage of the circuit, as illustrated in FIG. 7. At that time, all the read word lines WRA0, ..., WRA127 and WRB0, ..., WRB127 assume high potential level with the MOSFETs Q15 and Q16 of each dummy cell DC being all in the OFF-state.

When the corresponding read port is set to the selected state, the inverted internal control signals $\overline{PRA}$ or $\overline{PRB}$ assumes high level in the dummy cell array DARY, which results in that the precharge MOSFETs Q5 and Q6 are turned off, whereby the precharge operation for the dummy cell bit lines BDA and BDB is interrupted. Further, the read word lines WRA0, ..., WRA127 or WRB0, ..., WRB127 are brought to the selected state in an alternative manner, whereby the MOSFET Q15 or Q16 of the corresponding dummy cell DC is set to the ON-state. Consequently, the level on the dummy bit line BDA and BDB lowers progressively in dependence on the conductances of the four MOSFETs Q15, Q17, Q55 and Q57 or Q16, Q18, Q56 and Q58, as can be seen in FIG. 7.

As described previously, the MOSFETs Q15 to Q18 of the dummy cell DC are implemented in the same structure as the read control MOSFETs Q11 and Q12 of the static type memory cell MC constituting the memory cell array MARY. Hence, the former has the conductance of substantially same value as the latter and exhibits essentially identical process variation behavior with the latter. Similarly, the MOSFETs Q55 to Q58 are of the same structure as the N-channel MOSFETs Q5 and Q54 which are included in the inverters N2 and N3 constituting the latch circuit of the static type memory cell MC and have the respective conductances which are of a substantially same value that of the N-channel MOSFETs Q5 and Q54. Thus, the MOSFETs Q55 to Q58 exhibit same process variation with that of the N-channel MOSFETs Q5 and Q54. In this conjunction, it is however noted that when the magnitude of level lowering from the precharge voltage of the bit read line BRA0, ..., BRA7 or BRB0, ..., BRB7 taking place in the read operation is represented by $\Delta VD$, the magnitude of level lowering or drop of the dummy cell bit lines BDA and BDB is smaller than the value $\Delta VD$ and more preferably about a half of $\Delta VD$, i.e., 0.5 $\Delta VD$, without being affected by the process variations. This may be explained by the fact that the selected dummy cell presents a greater resistance than that of the selected memory cell and hence the discharge time constant of the former is longer than that of the latter. This level change of the dummy cell bit lines BDA and BDB is transmitted to the inverted input terminal of the unit sense amplifier USAA0 or USAB0 or other of the sense amplifier block SAA or SAB mentioned hereinbefore by way of the associated common dummy data line CDDA or CDDB. Furthermore, although the read signal from the static type memory cell MC and that of the dummy cell DC are shown in FIG. 7 as having relatively large signal amplitude, this is only for the illustrative purpose. In actuality, these signals are of extremely small amplitude. Accordingly, it is required that the unit sense amplifiers of the sense amplifier block SAA or SAB have a very high sensitivity.

At this juncture, it should also be mentioned that each of the unit sense amplifiers which constitute the sense amplifier blocks SAA and SAB is implemented as a so-called differential input type sense amplifier, as is exemplified by a unit sense amplifier USAA0 shown in FIG. 6, and includes two level shift circuits LS1 and LS2 and one differential amplifier DA connected substantially in a serially coupled configuration. Of the components mentioned above, the shift level circuit LS1 has a non-converted input node which serves as the non-inverted input terminal of each of the unit sense amplifiers and is coupled to the corresponding common data read line CDRA or CDRB. On the other hand, the inverted input node of the level shift circuit LS1 serves as the inverted input terminal of each unit sense amplifier and is coupled to the corresponding common dummy data line CDDA or CDDB. Further, the non-inverted output node and the inverted output node of the level shift circuit LS1 are coupled to the non-inverted input node and the inverted input node, respectively, of the level shift circuit LS2, while the non-inverted output node and the inverted output node of the level shift circuit LS2 are coupled to the non-inverted input node and the inverted input node, respectively, of the differential amplifier DA. The level shift circuits LS1 and LS2 and a N-channel drive MOSFET Q6 of the differential amplifier DA are supplied with the internal control signal SCA from the read timing generation circuit TGRA or TGRB. It should be recalled that the internal control signal SCA assumes low level such as the ground potential of the circuit when the corresponding read port is set to the non-selected state, while it assumes high level such as potential of the source voltage at a predetermined timing when the read port is set to the selected state, as can be seen in FIG. 7.

The inverted output signal of the differential amplifier DA mentioned above is supplied to one of the input terminals of a NAND gate NA1 constituting a part of an output latch circuit OL via inverters N4 and N5. The NAND gate NA1 has the other input terminal coupled to the output terminal of a NAND gate NA2, wherein the output terminal of the NAND gate NA1 is coupled to one of input terminals of the NAND gate NA2. In this manner, the NAND gates NA1 and NA2 are interconnected in a latch configuration. The other input of the NAND gate is supplied with the internal control signal SCA via the inverter N6. The output signal of the NAND gate NA1 which constitutes the unit sense amplifier USAA0 or other of the sense amplifier block SAA is supplied to a corresponding unit circuitry which constitutes a part of the data output buffer DOBA (see FIG. 2) as the read data RDA0 or other. On the other hand, the output signal of the unit sense amplifier USB0 or other of the sense amplifier block SAB having the respective non-inverted input terminals coupled to the read bit line BRB0, ..., BRB7 is inverted by the inverter N1 and then supplied to the corresponding unit circuitry of a data output buffer DOBB as the read data RDB0, as is illustrated in FIG. 3, whereby the logic level of the read signal is corrected. Referring to FIG. 2, the output signals of individual unit circuitries of the data output buffer DOBA are outputted from corresponding data output terminal DOA0, ..., DOAz as the output data doa0, ..., doaz, while the output signals of the unit circuitries of the data output buffer DOBB are outputted from corresponding data output terminals DOB0, ..., DOBz as output data dob0, ..., dobz.

By virtue of the arrangement described above, the read signal inputted to the non-inverted input terminal of the unit sense amplifier USAA0 or USAB0 from the selected static type memory cell MC of the memory cell array MARY via the common data read line CDRA or CDRB on one hand and the dummy read signal inputted to the inverted input terminal of the unit sense amplifier USAA0 or USAB0 via the common dummy data line from the dummy cell DC coupled to the selected read word line of the dummy cell array DARY on the other hand undergo DC level shift by the level shift circuits LS1 and LS2 of each unit sense amplifier with the level difference being increased to a predetermined bias level at which the sensitivity of the differential amplifier DA becomes maximum.

As described hereinbefore, magnitude of the level lowering of the dummy read signal outputted from the dummy cell DC should preferably be about a half of the level drop $\Delta VD$ of the read signal outputted from the static type memory cell MC. As a result of this, the dummy read signal outputted from the dummy cell DC can assume substantially an intermediate level between the logic "1" level and the logic "0" level of the read signal outputted from the static type memory cell MC and can thus be used as a reference potential for discriminating the logical levels of the read signal from one another. Besides, the level difference between this reference potential and the read signal outputted from the static type memory cell MC is caused to increase progressively immediately in succession to the start of the memory cell select operation (i.e., immediately after the start of the discharge from the precharged bit read line). In other words, the reference potential and the read signal outputted from the memory cell MC has a predetermined difference in the level immediately after the start of the memory cell select operation, wherein this level difference is stabilized without being affected by the process variation or other influences. As the overall result, the read signal amplifying operation of the sense amplifier can be started at an earlier stage with an increased operation margin being afforded to the sense amplifier, while the logical level deciding operation executed by the sense amplifier for the read signal can significantly be stabilized. Thus, there can be realized reduction in the layout area as required as well as simplification of the layout design while ensuring stabilized operation and low power consumption of the multi-port memory device.

Now referring to FIG. 8, each of the static type memory cells MC which constitute the memory array MARY has an N-type diffusion layer N+ formed on a P-type semiconductor substrate as a source region and a P-type diffusion layer P+ formed in a N-type well realized in the substrate as a drain region. Formed overlying these diffusion layers with interposition of predetermined insulation films are polysilicon layers PS1, ..., PS5 which serve as gates of the individual MOSFETs. Formed over these polysilicon layers in the horizontal direction are the word read lines WRA0, WRB0, etc., which are formed by a first aluminum connection layer AL1 and the write word lines WW0 and others formed by a third aluminum connection layer AL3 while the non-inverted write bit line BW0, the inverted write bit line BW0B, etc. and the read bit lines, BRA0; BRB0, etc. are formed by a second aluminum connection layer AL2 and extend in the horizontal direction.

Of the polysilicon layers mentioned above, the layer PS1 is used as the gate of the write control MOSFET Q51 on one hand while being used as the gate of the write control MOSFET Q52 or the other hand, wherein the polysilicon layer PS1 is coupled to the word write lines WW0 or other via a corresponding contact. The drains of the MOSFETs Q51 and Q52 are coupled to the non-inverted bit write line BW0 or the inverted write bit lines BW0B, etc., via corresponding contacts, respectively, while the sources of these MOSFETs Q51 and Q52 are coupled straightforwardly to the drain of the MOSFET Q54 or Q53 which constitutes the latch circuit. The polysilicon layer PS5 is coupled to the read word line WRA0 via a corresponding contact to serve as the gate of the read control MOSFET Q11. The polysilicon layer PS2 is coupled to the read word line WRB0 or other via a corresponding contact so as to serve as the gate of the read control MOSFET 12. The drains of the MOSFETs Q17 and Q12 are coupled to the read bit lines BRA0 or BRB0, etc. via corresponding contacts, while the sources of these MOSFETs Q11 and Q12 are coupled straightforwardly to the drain of the MOSFET Q14 or Q13 which constitutes a part of the latch circuit.

The polysilicon layer PS3 is used as the gates of the MOSFETs Q13 and Q53 which constitute one part of the latch circuit and additionally coupled to the common drain of the MOSFETs Q14 and Q54 which constitute other parts of the latch circuit. Similarly, the polysilicon layer PS4 is used as the gate of the MOSFETs Q14 and Q54 constituting the latch circuit and additionally coupled to the common drain of the other MOSFETs Q13 and Q54 of the latch circuit. The MOSFETs Q13 and Q14 have respective sources coupled to the source voltage of the circuit, i.e., a source voltage supply line VDD formed of the second aluminum wiring layer AL2 through respective contacts and aluminum connection layers while the sources of the MOSFETs Q53 and Q54 are coupled to the ground potential of the circuit, i.e. a ground potential supply line VSS formed of the second aluminum connection layer AL2 through associated contacts and aluminum connection layers.

In the case of the instant embodiment, the ground potential supply line VSS is disposed between the non-inverted write bit line BO0 and the inverted write bit line $\overline{BW0}$, etc., on one hand and the read bit line BRA0, BRB0, etc., on the other hand, while the source voltage supply line VDD is disposed between the read bit lines BRA0, BRB0, etc., and the adjacent non-inverted and inverted write bit lines. As described previously, the complementary write signal transmitted through the write bit line BW0, etc., is caused to swing fully between the source voltage level and the ground potential level of the circuit, while the read signal of the static type memory cell MC transmitted through the read bit lines BRA0 and BRB0 or others have a very small signal amplitude. As a consequence, when these write bit and read lines are disposed closely to each other, there may be induced noise of relatively large magnitude on the read bit line by the complementary write signal of the full-swing amplitude transmitted through the write bit line, which will result in inversion of the read signal. To cope with this problem, according to the teaching of the present invention incarnated in the instant embodiment, the source voltage supply line VDD or the ground potential supply line VSS is disposed between the write bit line and the read bit line so that these supply lines function as so-called shield conductor to suppress noise induced on the read bit line from the write bit line. By virtue of this arrangement, the read operation of the three-port RAM device can further be stabilized.

Again referring to FIG. 2, the three-port RAM device according to the instant embodiment is provided with an address comparison circuit ADC which receives the internal address signals aw0, ..., aw9 from the write address buffer ABW and the internal address signals ara0, ..., ara9 and arb0, ..., arb9 from the read address buffers ABRA and ABRB, respectively. This address comparison circuit ADC compares the internal address signals aw0, ..., aw9 with the internal address signals ara0, ..., ara9 and arb0, ..., arb9 on a bit-by-bit basis to thereby set selectively the output signal ama or amb to high level when coincidence is found between these internal address signals for all the bits. The output signal ama of the address comparison circuit ADC is supplied to the sense amplifier circuit SAA, while the output signal amb is supplied to the sense amplifier circuit SAB. Further, the data input signals di0, ..., diz are coupled to the sense amplifier circuits SAA and SAB.

When the output signal ama of the address comparison circuit ADC is at high level, the complementary write signals outputted from the write amplifier circuit WA are inputted straightforwardly to the unit sense amplifiers of the sense amplifier block SAS to be outputted as the output data doa0, ..., doaz. Similarly, when the output signal amb of the address comparison circuit ADC is at high level, the complementary write signals outputted from the write amplifier circuit WA are inputted straightforwardly to the unit sense amplifier of the sense amplifier block SAB to be outputted as the output data dob0, ..., dobz. In this manner, in the three-port RAM device according to the instant embodiment of the present invention, preference is put to the input data di0, ..., diz inputted from the write port when a same address is designated by the write port and either one of the read ports, whereby the input data di0, ..., diz are delivered as the output data doa0,..., doaz or dob0,..., dobz, as they are. In this manner, normal read operation can be realized even when a so-called collision should take place between the write port and the read port.

As will now be appreciated from the forgoing description, the teachings of the present invention provide the following advantageous effects when applied to a multi-port memory device such as three-port RAM device which is incorporated in a digital switch integrated circuit for a time-sharing digital exchange.

(1) Owing to such arrangement that each of the read bit lines of the multi-port memory device is constituted by a simplex or single-ended signal line with the read bit lines being precharged to the source voltage of high potential and that a plurality of dummy cell bit lines are provided each of which is capable of cooperating with an arbitrary one of the individual read bit lines, wherein the sense amplifier for amplifying the read signal is implemented in the so-called differential input configuration with the non-inverted and inverted input terminals thereof being virtually connected to the memory cell read bit line and the dummy cell bit line, respectively, there are obtained such advantageous effects that the signal amplitude on the memory cell read bit line can be diminished to thereby reduce the read current while ensuring stabilized operation of the sense amplifier for amplifying the read signal.

(2) In the arrangement described in the above paragraph (1), implementation of the dummy cell coupled to each dummy cell bit line basically by four MOSFETs coupled substantially in a serial connection, wherein two of the MOSFETs are realized in the same structure as the read control MOSFET of the static type memory cell with the other two being realized in the same structure as the N-channel MOSFETs constituting the inverter of the latch circuit for the memory cell, provides such advantageous effect that the reference or standard potential can be stabilized by the dummy cell, whereby operation margin of the sense amplifier can be enlarged.

(3) In the arrangement described in the above paragraphs (1) and (2), disposition of the shield conductors virtually constituted, for example, by the source voltage supply line or ground potential supply line between the memory cell write bit line and the memory cell read bit line can provide such benefit that noise induced on the memory cell read bit line due to full-swing of the signal on the write bit line can satisfactorily be suppressed to protect the sense amplifier from erroneous operation.

(4) By virtue of the arrangements described in the above paragraphs (1) to (3), reduction in the layout area as required as well as simplification of the layout design can be achieved while ensuring low power consumption and stabilized operation of the multi-port memory device, to further advantageous effects.

(5) Owing to the effects mentioned in the above paragraph (4), low power consumption of the digital switch integrated circuit comprising the multi-port memory devices and hence the time-sharing digital exchange and the like can be enhanced while improving the reliability thereof.

In the foregoing, the present invention has been described in detail in conjunction with the preferred or exemplary embodiment. However, it goes without saying that the present invention is never restricted to the illustrated embodiment. Many modifications and versions or change of equivalents may readily occur to those skilled in the art without departing from the spirit and scope of the present invention. By way of example, the number of the data bits inputted to or outputted from the three-port RAM device shown in FIG. 2 is never limited to 36 bits. Needless to say, the storage capacity of the three-port RAM device can be selected arbitrarily. Further, it is no indispensable condition for the three-port RAM device to include the address comparison circuit ADC. Of course, the structure of the illustrated three-port RAM device imposes no restriction to the blockwise implementation of the multi-port memory device. In the memory cell array MARY shown in FIG. 3, the numbers of the word lines and the bit lines can arbitrarily be selected. Besides, the inverter N1 for inverting the output signal of the unit sense amplifier of the sense amplifier block SAB may be provided, for example, at the output side of the unit circuitry constituting a part of the data output buffer DOBB (FIG. 2). Moreover, the static type memory cell MC constituting a part of the memory cell array MARY may be realized as a memory cell of high-resistance load type.

Figure 9:
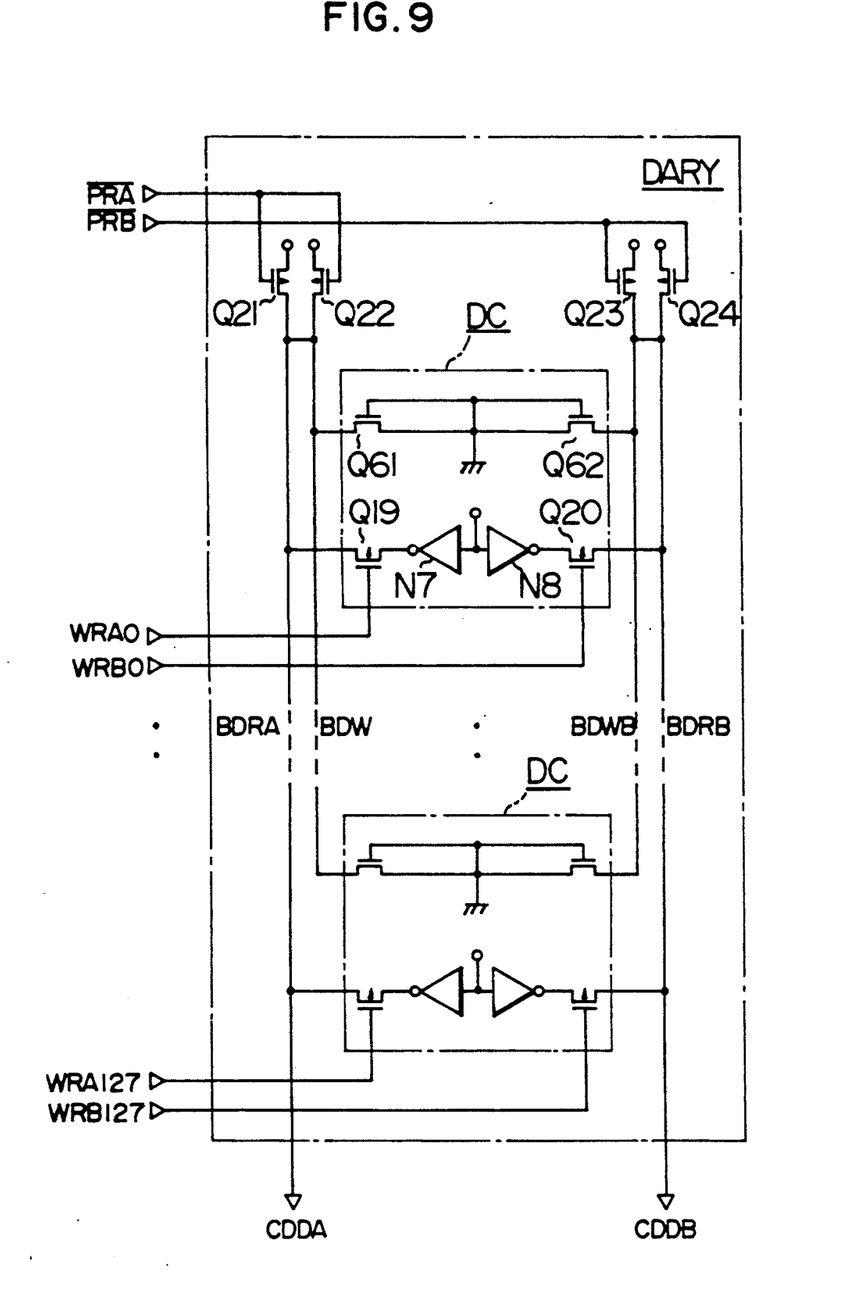
FIG. 9 is a circuit diagram showing another example of a dummy cell which may be included in the dummy cell array shown in FIG. 3.

Further, referring to FIG. 5, the dummy cell DC of the dummy cell array DARY may be implemented in a variety of circuit configurations on the condition that potential level lowering of the dummy read signal on the dummy cell bit lines BDA and BDB is smaller than the level drop or lowering of the read signal on the read bit lines BRA0 and BRB0, etc., and preferably a half of the latter. By way of example, the dummy cell DC may be realized in a basically same structure as the static type memory cell MC, wherein the non-inverted dummy cell bit write line BDW is short-circuited to the dummy cell bit line BDRB with the parasitic capacitance of each dummy cell bit line being selected about twice as high as that of the read bit line BRA0, BRB0, etc., as shown in FIG. 9, and the level lowering of the dummy read signal on each dummy cell bit line may be made substantially equal to a half of the level drop in the read signal on the read bit line BRA0, BRB0, etc. In other words, by selecting the capacitance of the dummy cell bit line so as to be greater than that of the memory cell bit line and preferably twice as high as the latter, the discharge time constant of the selected or enabled dummy cell becomes longer and more preferably twice as long as the discharge time of the selected dummy cell. Further, it should be understood that the memory cell array MARY, dummy cell array DRAY, the static type memory cell MC, dummy cell DC and the sense amplifier units SAA and SAB shown in FIGS. 3 to 6 and FIG. 9 are susceptible to numerous modifications and variations in respect to specific circuit configurations, polarity of the source voltage, conductivity type of the MOSFETs within the spirit and scope of the present invention, and same holds true for the static type memory cell MC and the layout of peripheral circuitries thereof.

Although the foregoing description has been made on the assumption that the invention is applied to the three-port RAM device included in the digital switch integrated circuit for the time-sharing digital exchange, it should be understood that the invention is never restricted to such three-port RAM device. The present invention can equally be applied to other three-port RAM devices, two-port RAM devices or multi-port memory device in more general sense which have four or more access ports and which are used in various digital systems inclusive of computers. In other words, the present invention can find applications to a multiport memory device including as basic elements at least the static type memory cells and having a plurality or multiplicity of access ports as well as digital integrated circuits which include such multi-port memory devices.

We claim:

1. A multi-port memory device comprising:
   a memory cell array including at least one memory block each having a plurality of memory cells arranged in rows and columns, said memory cells being connected with word lines extending in a row direction and with memory cell bit lines extending in a column direction;
   a plurality of dummy cells, one provided for each row of memory cells in each of said memory blocks so that the dummy cells are connected with associated ones of said word lines extending in the row direction, said dummy cells further being connected with dummy cell bit lines extending in the column direction; and
   sense amplifier means connected to receive outputs of those memory cells in said memory cell array which are selected in a memory cell selection operation and outputs of those dummy cells among said plurality of dummy cells which are selected in said memory cell selection operation for amplifying differences between said selected memory cell outputs and said selected dummy cell outputs.

2. A multi-port memory device comprising:
   a memory cell array including at least one memory block each having a plurality of memory cells arranged in rows and columns, said memory cells being connected with word lines extending in a row direction and with memory cell bit lines extending in a column direction;
   a plurality of dummy cells, one provided for each row of memory cells in each of said memory blocks so that the dummy cells are connected with associated ones of said word lines extending in the row direction, said dummy cells further being connected with dummy cell bit lines extending in the column direction;
   means for precharging said memory cell bit lines and dummy cell bit lines to a predetermined precharge voltage when said memory cell array is not subjected to a memory cell selection operation so that reading of information from a memory cell is effected in terms of a change of a voltage of a memory cell bit line from said predetermined precharge voltage with which the memory cell is connected, said dummy cells having a time constant larger than that of said memory cells; and
   sense amplifier means connected to receive first discharge signals from memory cell bit lines connected with those memory cells in said memory cell array which are selected in a memory cell selection operation and second discharge signals from dummy cell bit lines connected with those dummy cells among said plurality of dummy cells which are selected in said memory cell selection operation for amplifying differences between said first and second discharge signals and delivering the amplified differences as information read from said memory cell array.

3. A multi-port memory device according to claim 2, wherein said memory cell bit lines include write complementary memory cell bit lines and read memory cell bit lines.

4. A multi-port memory device according to claim 2, wherein said dummy cells have a time constant substantially twice as large as that of said memory cells.

5. A multi-port memory device according to claim 2, wherein said dummy cells exhibit, when selected, a resistance larger than that of a selected memory cell so that the time constant for said dummy cells is larger than that of said memory cells.

6. A multi-port memory device according to claim 2, wherein each of said dummy cell bit lines has a capacitance larger than that of each memory cell bit line so that the time constant for said dummy cells is larger than that of said memory cells.

7. A multi-port memory device according to claim 3, wherein shielding line conductors are provided such that each of said shielding line conductors is arranged between write complementary memory cell bit lines and a read memory cell bit line adjacent thereto.

8. A multi-port memory device having a plurality of memory cells, comprising:
   write bit lines each including complementary signal lines connected to writing terminals of the memory cells;
   read bit lines each including of a single-ended signal line connected to reading terminals of the memory cells;
   dummy bit lines connected to dummy cells and provided in correspondence to said read bit lines, respectively; and
   sense amplifiers of differential input type each having a non-inverted input terminal connected to a corresponding one of said read bit lines and an inverted input terminal connected to a corresponding one of said dummy bit lines.

9. A multi-port memory device according to claim 8, wherein said multi-port memory device is a three-port RAM device having one set of said write bit lines and a pair of read bit lines provided in correspondence to each of column addresses.

10. A multi-port memory device comprising:
    write bit lines each including complementary signal lines;
    first and second read bit lines each including of a single-ended signal line;
    first and second dummy bit lines provided in correspondence to said read bit lines, respectively; and
    sense amplifiers of differential input type each having a non-inverted input terminal connected to a corresponding one of said read bit lines and an inverted input terminal connected to a corresponding one of said dummy bit lines;
    a write word line and said first and second read word lines provided in correspondence to each of row address,
    said write bit lines and the first and second read bit lines provided in correspondence to each of column addresses; and
    wherein said multi-port memory device includes a plurality of static type memory cells, each of said memory cells comprising:
    a latch circuit including first and second CMOS inverters cross-coupled to each other, said latch circuits included in said plurality of static type memory cells, respectively, being disposed in rows and columns at cross-points between said write word lines and said first and second read word lines on one hand and said write bit lines and said first and second read bit lines on the other hand;

wherein each of said latch circuits has first non-inverted and inverted input/output nodes coupled to the corresponding ones of said write bit lines through a pair of write control MOSFETs having gates coupled to corresponding ones of said write word lines, said latch circuit having second non-inverted and inverted input/output nodes which are coupled to corresponding ones of said first and second read bit lines through first and second read control MOSFETs having a gate coupled to a corresponding one of said first or second read word lines.

11. A multi-port memory device according to claim 10, wherein said first and second read bit lines and said first and second dummy bit lines are precharged to a source voltage of high potential, and wherein said first and second read control MOSFETs are each constituted by a P-channel MOSFET.

12. A multi-port memory device according to claim 10, wherein said first and second dummy bit lines are coupled to a source voltage of low potential by way of first P-channel MOSFETs having respective gates coupled to corresponding ones of said first and second read word lines, second P-channel MOSFETs provided in a serial connection to said first P-channel MOSFETs and first and second N-channel MOSFETs;

said first and second P-channel MOSFETs being implemented in a substantially same structure as said first and second read control MOSFETs in said memory cell, while said first and second N-channel MOSFETs are implemented in a substantially same structure as N-channel MOSFETs included in first and second CMOS inverters which constitute said latch circuit;

wherein said precharged first and second dummy bit lines have a discharge time constant greater than that of said precharged first and second read bit lines.

13. A multi-port memory device according to claim 11, wherein said first and second dummy bit lines are each coupled with parasitic capacitance which is substantially twice as large as that of said first and second read bit lines so that said precharged first and second dummy bit lines have the discharge time constant which is substantially twice as long as that of said precharged first and second read bit lines.

14. A multi-port memory device according to claim 10, wherein said second read bit line being coupled to a corresponding one of said second inverted input/output nodes of said latch circuit, wherein an output of each of said sense amplifiers having a non-inverted input terminal coupled to said second read bit line is delivered after having been inverted by inverter means.

15. A multi-port memory device having a plurality of memory cells, comprising write bit lines each including of complementary signal lines coupled to writing terminals of the memory cells, and read bit lines each including a single-ended signal line coupled to reading terminals of the memory cells, wherein a shield line is disposed between said write bit lines and said read bit lines to suppress adverse influences by signals on said write bit lines upon signals on said read bit lines which are adjacent to said write bit lines.

16. A multi-port memory device according to claim 15, wherein said shield line includes at least one of a source voltage supply line and a ground potential supply line.

17. A multi-port memory device according to claim 9, wherein each of the ports of the three-port RAM can be made active independently of the other ports so that simultaneous operation of the ports is possible.

* * * * *